United States Patent [19]

Kusko et al.

[11] Patent Number: 5,065,104
[45] Date of Patent: Nov. 12, 1991

[54] FAULT SENSING WITH AN ARTIFICIAL REFERENCE POTENTIAL PROVIDED BY AN ISOLATED CAPACITANCE EFFECT

[75] Inventors: Alexander Kusko, 161 Highland Ave., Needham Heights, Mass. 02194; Noshirwan K. Medora, North Attleborough, Mass.

[73] Assignee: Alexander Kusko, Weston, Mass.

[21] Appl. No.: 587,559

[22] Filed: Sep. 21, 1990

Related U.S. Application Data

[63] Continuation of Ser. No. 15,318, Feb. 17, 1987, abandoned.

[51] Int. Cl.$^5$ ............................................. G01R 31/00
[52] U.S. Cl. ..................................... 324/508; 324/122; 324/133; 340/650; 361/42
[58] Field of Search ............... 324/508, 509, 510, 511, 324/133, 122; 340/649, 650, 651, 652; 361/42

[56] References Cited

U.S. PATENT DOCUMENTS

| | | | |
|---|---|---|---|
| 1,906,644 | 5/1933 | Sleeper | 324/122 |
| 3,287,603 | 11/1966 | Sosnoski . | |
| 3,320,480 | 5/1967 | Failor . | |
| 3,386,004 | 5/1968 | Dwyer . | |
| 3,407,336 | 10/1968 | Embree . | |
| 3,426,342 | 2/1969 | DeLangis . | |
| 3,621,392 | 11/1971 | Liebermann et al. . | |
| 3,659,152 | 4/1972 | DeLangis . | |
| 3,708,721 | 1/1973 | Marcade et al. . | |
| 3,783,340 | 1/1974 | Becker . | |
| 3,860,868 | 1/1975 | Lindell et al. | 324/133 |
| 3,961,319 | 6/1976 | Asberry . | |
| 4,016,489 | 4/1977 | Adams et al. . | |
| 4,075,675 | 2/1978 | Burkett et al. . | |
| 4,111,516 | 9/1978 | Wireman | 324/508 X |
| 4,164,703 | 8/1979 | Pereda | 324/508 |
| 4,292,585 | 9/1981 | Charette | 324/508 X |
| 4,298,864 | 11/1981 | Mahnke et al. . | |
| 4,368,498 | 1/1983 | Neuhouser . | |
| 4,506,260 | 3/1985 | Woodruff et al. . | |
| 4,724,382 | 2/1988 | Schauerte | 324/133 |
| 4,929,887 | 5/1990 | Robitaille et al. | 324/508 X |

FOREIGN PATENT DOCUMENTS

| | | |
|---|---|---|
| 1047695 | 12/1953 | France . |
| 43-10005 | 4/1968 | Japan . |
| 852333 | 10/1960 | United Kingdom . |

OTHER PUBLICATIONS

"Simple Circuit Monitors 'Third Wire' in ac Lines", NASA Tech Briefs, Spring 1980, vol. 5, No. 1, p. 4.

Primary Examiner—Kenneth A. Wieder
Assistant Examiner—Robert W. Mueller
Attorney, Agent, or Firm—Fish & Richardson

[57] ABSTRACT

A ground fault detector has a neon bulb connected between a rectangular copper plate connected to an antenna wire and a resistor connected to one arm of a double-pole double-throw relay with the stationary contacts cross coupled to hot and neutral wires of a three-wire A.C. line. A photocell detector is optically coupled to the neon bulb and provides a signal to a live wire detector circuit when the neon bulb is illuminated to disable operation of the relay. A timer circuit causes the live wire detector circuit to operate the relay when the neon bulb is not illuminated after a predetermined time. A network is photo-optically coupled to a ground status detector that controls a contactor that selectively connects power to the equipment being monitored. The junction of a Y network is also coupled to the input of the ground status detector. The input of the photo-optical coupler is connected between a leg of the Y circuit and the enclosure of the equipment being monitored. Another leg of the Y network is connected to the enclosure of the equipment being monitored.

26 Claims, 6 Drawing Sheets

FAULT SENSING WITH AN ARTIFICIAL REFERENCE POTENTIAL PROVIDED BY AN ISOLATED CAPACITANCE EFFECT

The present invention is a continuation of Ser. No. 09/015,318 filed Feb. 17, 1987, now abandoned, which relates in general to fault sensing and more particularly concerns novel apparatus and techniques for detecting the absence of a grounding connector to a specific electrical equipment, detecting a fault between the live wire and metal parts or enclosure of a specific electrical equipment and continuously monitoring the equipment to provide a visual and/or audible indication of a fault and/or disable the equipment when an unsafe condition is sensed.

The invention may also sense an unsafe condition before power is applied and prevent the application of power.

Electrical equipment is grounded (connected to "earth") in order to (1) prevent electric shock if a fault occurs in the equipment; (2) provide a path for fault current to operate a fuse or circuit breaker; (3) prevent buildup of static charges that can cause error in data processing equipment; and (4) prevent buildup of static charges that can cause a spark and explosions in hazardous atmospheres. The grounding is accomplished by a green safety wire in the cord, by a separate grounding jumper or by the metallic conduit that carries the wires to the equipment. The National Electrical Code provides specific requirements for grounding.

The problem solved by the invention will be better understood in the light of the following list of definitions.

1. AC power cord. (three-wire) The three-wire cord which carries 120 VAC 1-phase power to the electrical equipment. It consists of three insulated wires, color coded for identification purposes as black, white and green. The cord is connected to a receptacle with a three-prong plug.

2. Live wire. The black wire is identified as the "alive" or "hot" wire in the 120 VAC power cord.

3. Neutral wire. The white wire is identified as the neutral wire in the 120 VAC power cord. The neutral wire is connected to ground where the electric power service enters the building.

4. Safety ground wire. The green wire is referred to as the "ground" wire or the "safety ground" in the 120 VAC power cord. The green wire is connected to ground at the distribution panel. It serves to ground the enclosure and metal parts of the load equipment to prevent the buildup of hazardous voltages, and to provide a path for fault current so that the fuse or circuit breaker will operate.

5. AC power cord. (two-wire) A power cord with only a black and a white wire, no green wire. The cord is connected to a receptacle in a two-prong plug. Which wire is live depends on the position of the plug in the receptacle.

6. Ground. Any low-resistance electrical path to earth, e.g., water pipe, ground rod, structural element of a building, etc.

7. Fault. An unintentional electrical connection or "short circuit" between the live electrical terminal and the metal parts or enclosure of the equipment.

8. Receptacle (three-wire). A receptacle with three sockets: one for the hot or black wire of the plug; one for the neutral or white wire; one for the safety ground or green wire.

9. Receptacle (two-wire). A receptacle with two sockets: one for the hot or black wire of the plug; one for the neutral or white wire.

The grounding of the equipment can be ineffective for the following reasons:

1. The green safety wire is disconnected at the equipment.

2. A two-wire cord is used with no green safety wire.

3. The three-prong plug is plugged into a two-socket receptacle, using an adapter. The grounding pigtail of the adapter is not connected.

4. The ground socket of the receptacle is not grounded within the receptacle.

5. The green safety wire is broken in the cord.

The security of the grounding can be checked by connecting an ohmmeter between the equipment and a known ground, such as a metal electrical conduit. However, this approach does not provide a continuous check on the status of the grounding, and requires a nearby known ground. Accordingly, a number of approaches have been followed in the prior art. A search of subclasses 649–52 of class 340 and subclass 42 of class 361 uncovered U.S. Pat. Nos. 3,287,603, 3,320,480, 3,386,004, 3,407,336, 3,426,342, 3,621,392, 3,659,152, 3,708,721, 3,783,340, 3,961,319, 4,016,489, 4,075,675, 4,298,864, 4,368,498, and 4,506,260, British Patent 852,333, French Patent 1,047,695, Japanese Patent 43-10005 and a publication entitled "Simple Circuit Monitors ,Third Wire, in ac Lines.*

It is an important object of this invention to provide improved apparatus and techniques for fault detecting.

According to the invention, there is circuit means for providing a reference ground potential independent of a normally grounded conductor. There is means for sensing the potential on the a-c lines for determining which is the live wire of a two or three-wire cord independently of the potential of the live, neutral and ground wires in the power system. There is means for visually indicating all existing states of the equipment ground, including ground OK, ground open and ground-to-line fault conditions. Preferably, there is means responsive to the line-to-ground fault condition for disabling the equipment being monitored and latching it in this off-mode until manually reset. According to another aspect of the invention, there is means for sensing a preexisting fault condition before applying power to the equipment being monitored and preventing application of power to the equipment. According to a feature of the invention, the invention includes means for sensing the actual equipment ground voltage with respect to the neutral terminal.

Numerous other features, objects and advantages of the invention will become apparent from the following specification when road in connection with the accompanying drawing in which:

FIGS. and 1A and 1B are diagrammatic representations of alternate means for mounting the grounding detector according to the invention built in or external to respectively the equipment being monitored;

Figure 1A:
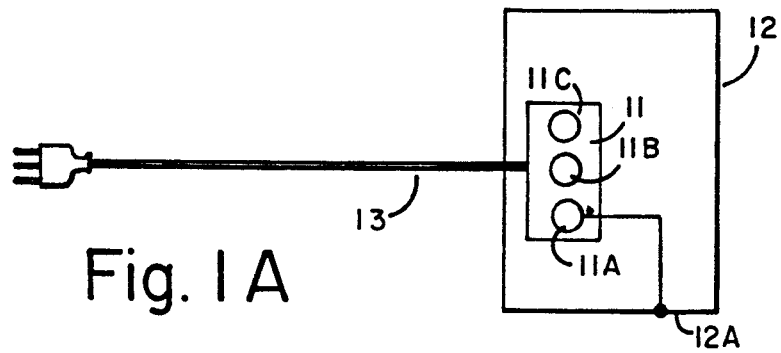
FIG. 1C is a diagrammatic representation of a plug-in detector.

With reference now to the drawing, and more particularly FIG. 1A thereof, there is shown a diagrammatic representation of one means for mounting grounding detector 11 internally of equipment 12 to be monitored. The three-wire equipment cord 13 is connected to grounding detector 11 having terminal 11A connected to the enclosure 12A of equipment 12 and live a-c terminals 11B and 11C.

Figure 1B:
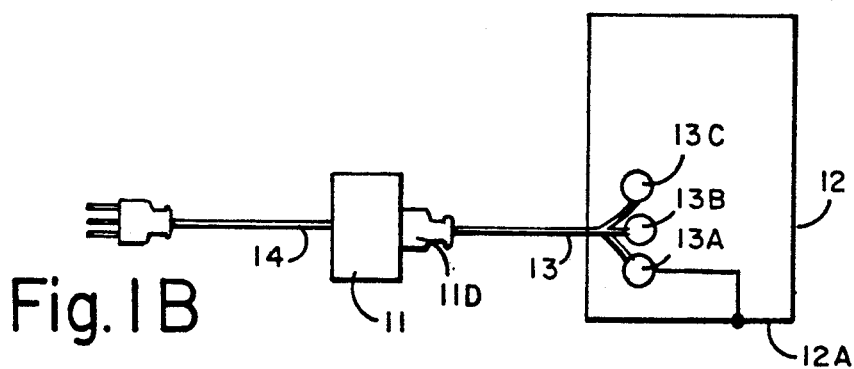

Referring to FIG. 1B, there is shown an alternate method for connecting grounding detector 11 to equipment 12 by plugging the plug at the end of equipment cord 13 to a receptacle 11D in grounding detector 11 that is in turn connected to the source of a-c energy through a three-wire extension cord 14. The green safety wire 13A of equipment cord 13 is connected to the enclosure 12A of equipment 12, and live a-c conductors 13B and 13C are connected to terminals of equipment 12 for receiving a-c energy.

The methods for mounting the grounding detector 1 shown in FIGS. 1A and 1B also apply to equipment connected to ground by means of a wire jumper. The equipment or extension cord may or may not have a green safety wire.

The grounding detector circuitry disclosed herein may be incorporated into existing electrical equipment or be factory installed into new equipment. It may be used for the following:

1. As a permanently installed monitoring unit for critical applications such as medical equipment, hospital beds, mobile homes etc. FIG. 1A is a diagrammatic representation of a permanently installed monitoring unit.

2. In an outlet strip for computers, shop and other electrical/electronic equipment. FIG. IB is a diagrammatic representation of one means for such an application.

3. In an outlet assembly at the end of an extension cord. FIG. IB is a diagrammatic representation of such a device.

Figure 1C:
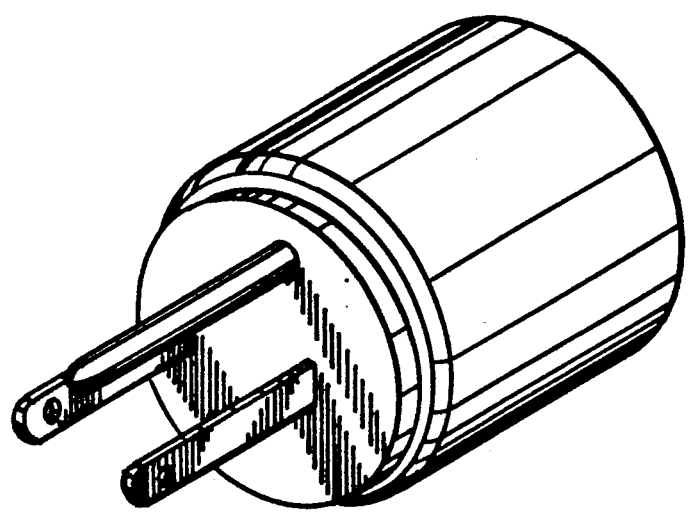

4. As a plug-in test detector for receptacles, wall outlets and extension cords. FIG. 1C is a diagrammatic representation of a plug-in test detector.

5. As a plug-in detector for industrial workplace grounding to check the presence of a positive ground when handling equipment that is sensitive to static electricity (FIG. 1C).

Figure 2:
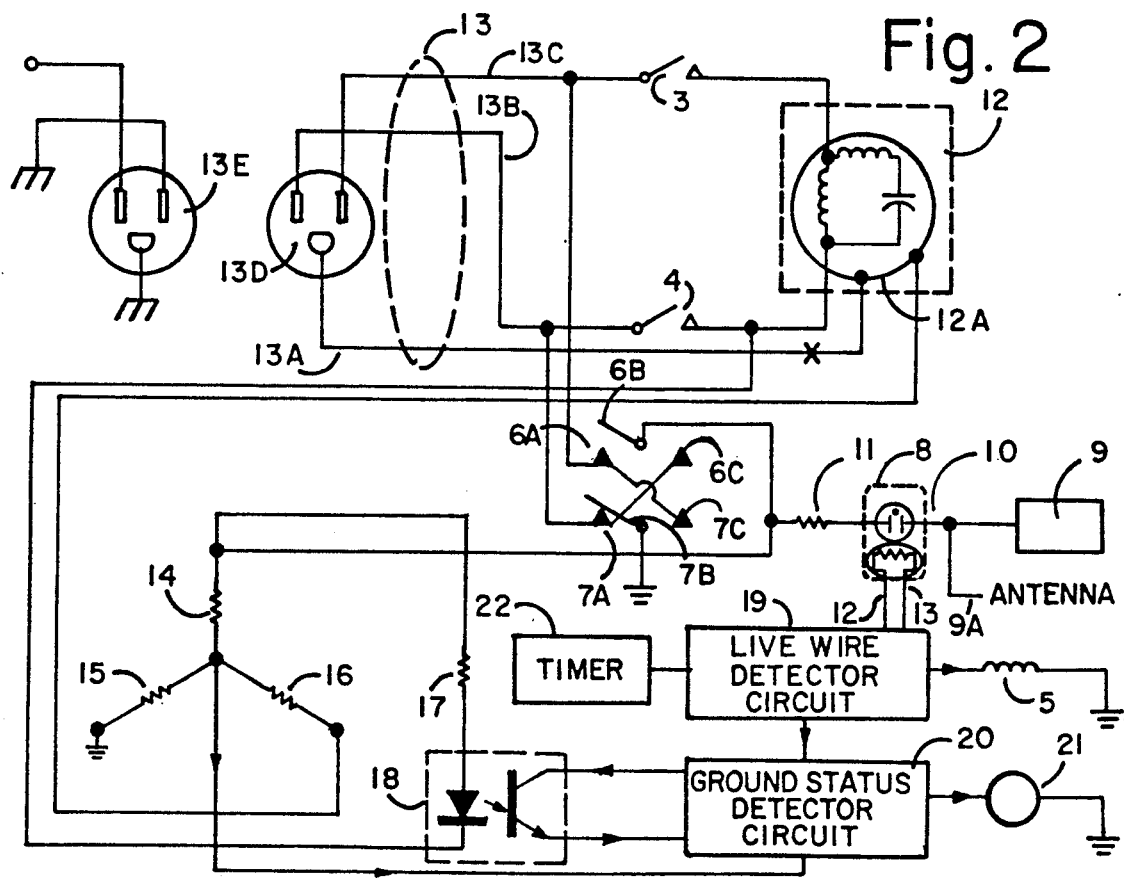
FIG. 2 is a combined block-schematic circuit diagram of a system according to the invention.

Referring to FIG. 2, there is shown a combined block-schematic circuit diagram of an embodiment of the invention. Equipment cord 13 including a hot black wire 13C, a neutral white wire 13B and a green ground safety wire 13A, the latter two not being hot, is connected to equipment 12. For illustration, the equipment 12 is a single-phase electric motor. Lines 13C and 13B are connected to windings of equipment 12 through initially open contacts 3 and 4 of contactor 21. Green ground wire 13A is directly connected to the enclosure 12A of equipment 12. A sensing lead is also connected from equipment enclosure 12A to one end of resistor 16 whose other end is connected to the junction of resistors 14 and 15 and connected to the input of ground status detector circuit 20. Normally hot black wire 13C and normally neutral white wire 13B are connected to terminals 6A and 7C and 7A and 6C, respectively, of a double-pole double-throw polarity reversing relay 5, whose arms 6B and 7B are connected to resistor 14 and logic power supply ground, respectively. Arm 6B is also being connected through resistor 11 to one electrode of the neon lamp of neon lamp-cadmium sulfide optoisolator assembly 8. The other electrode of the neon lamp is connected by wire 10 to reference ground plate 9 and antenna 9A. The end of resistor 14 connected to arm 6B is also connected through resistor 17 to the light emitting diode of optocoupler 18. The output of optocoupler 18 is connected to ground status detector circuit 20. The output of ground status detector circuit 20 is connected to contactor 21 that controls the state of contacts 3 and 4. Ground symbols in the lower electronics portion of FIG. 2 denote power supply grounds that are not connected to the power cord grounds at the upper left.

Neon lamp of neon lamp-Cds optoisolator 8 is optically coupled to a cadmium sulfide Cds detector having output leads 12 and 13 connected to live wire detector circuit 19 whose output is connected to relay 5 for operating the switch arms 6B and 7B. When the coil of relay 5 is not energized, arm 6B contacts 6A, and arm 7B contacts 7A. The output of timer 22 is connected to live wire detector circuit 19.

Plug 13D at the end of cable 13 is plugged into a 120 volt service receptacle 13E having hot, neutral and safety sockets as shown, with the neutral and safety sockets being normally grounded.

Having briefly described the structural arrangement, its mode of operation will now be described. When power is applied to the grounding detector circuit by inserting plug 13D into receptacle 13E, relay 5 is not energized, and contact 6A is connected to the hot or live terminal by hot black wire 13C. This live wire 13C is thus effectively connected to one electrode of neon lamp-CdS assembly 8 through resistor 11. The other electrode of neon lamp-CdS assembly 8 is connected to the reference ground plate 9 and antenna 9A to create an artificial ground reference potential at wire 10 by an isolated capacitance effect. Hence, the potential at wire 10 is lower than that at the junction between neon lamp 8 and resistor 11 and fires neon lamp 8 to provide a signal optically coupled by the CdS photodetective cell to live wire detector circuit 19 by wires 12, 13. This optoisolator provides high electrical isolation while operating at very low current levels of the order of one microampere.

Live wire detector circuit 19 includes a memory element for holding the status of relay 5. If however terminal 6A had the neutral wire connected to it, instead of the live wire, no signal would be received since the neutral wire would also be at zero volts or ground potential and thereby provide no potential difference across the electrodes of the neon lamp, of the neon lamp-CdS assembly 8. Neon lamp 8 would then remain extinguished and not provide a signal over lines 12 and 13 to live wire detector circuit 19. The absence of a signal on lines 12, 13 activates timer 22 and enables live wire detector circuit 19 to change the status of relay 5. This operation of relay 5 causes arms 6B and 7B to switch and thereby connect arm 6B to the live terminal then connected to terminal 6C and 7A, thereby creating a potential difference across neon lamp of neon lamp-CdS 8, illuminating it and sending a signal to live wire detector circuit 19 to hold the status of relay 5. The process just described is repeated until a signal is received from the CdS detector over leads 12 and 13, and the live terminal thus located. During this status check process, a checking status LED (not shown in FIG. 2) is on, but no power is applied to equipment 12.

After the live terminal is thus identified, the potential on arm 6B is sufficient to develop a current of the order of 150 microamperes through resistor 17 and the LED of optocoupler 18. If the safety ground 13A is broken and there is a fault in the equipment being monitored, for example, from the windings to the enclosure, there will be a current path through resistor 17, the LED of optocoupler 18, resistor 16 and resistor 15 to send an optically coupled signal to ground status detector circuit 20 that inhibits operation of power contactor 21. If the safety ground is okay, and a fault is present, the current path is through resistor 17, optocoupler diode 18 and to safety ground wire 13A, and to ground pin of socket 13D and 13E. In either case the monitoring current flows through optocoupler diode 18. Ground status detector 20 also excites a red LED (not shown in FIG. 2) to indicate the presence of a fault condition in the equipment 12. Status detector 20 also latches a driver circuit (not shown in FIG. 2) that keeps contacts 3 and 4 open until the circuit is manually reset by the operator.

While the prefault detection circuit is checking for a fault condition in the load, ground status circuitry checks whether the equipment ground through green safety wire 13A is connected or open. The voltage at the star or junction point of resistors 14, 15, 16, forming a star or Y network, is dependent upon whether the equipment ground is connected or floating. The open ground is indicated by illumination of a yellow LED (not shown in FIG. 2), and a solid ground is indicated by illuminating a green LED (not shown in FIG. 2). If there is no preexisting fault in the equipment, ground status detector 20 enables contactor 21 to close contacts 3 and 4 and thereby apply power to equipment 12. The status of the ground is continuously monitored, and any change is indicated by the green, yellow and red LEDs. If now a fault occurs in the load equipment, the new status is immediately detected, and corrective action taken. Contactor 21 is de-energized, opening contacts 3 and 4 and disconnecting equipment 12 from the power lines, and illuminating the red LED. The circuit is now latched in the off-state until manually reset by the operator.

The invention has a number of advantages. It needs no external reference potential because reference ground plate 9 and antenna 9A provide an internal reference ground potential. The invention provides nonpolar operation because the circuitry accurately identifies the live terminal in a two-wire or three-wire cord, independently of the potential of the live, neutral and green safety wires. The circuitry is thus polarity independent, an important feature, because the identity of the black and white wires as carrying live and neutral potentials, respectively, may not be correct when the power cord reaches the equipment.

The invention visually indicates the states of the equipment grounding through illuminating and extinguishing the respective LEDs. Furthermore, if a fault condition is identified, the circuit disables the power contactor driver and remains latched in this off-mode until manually reset by the operator.

The ground fault circuit also checks for a pre-existing fault condition in the load equipment to prevent a hazardous voltage from appearing on the equipment. By identifying a preexisting fault and preventing application of power, the circuitry helps to protect the faulty equipment from further damage. Furthermore, this feature helps prevent a circuit breaker from being tripped and thereby allows the remaining equipment on the line to receive operating power. The invention operates from a standard 120 VAC two-wire or three-wire cord. No separate monitoring wires are required. The invention first locates the line and neutral terminals, and then measures the actual equipment ground voltage with respect to the neutral terminal, unlike prior art circuits which measure the continuity between the equipment ground and an existing reference ground. The measurement of actual ground voltage is more conclusive from the standpoint of safety than measuring the ground continuity between the equipment and the point of reference because the point of reference may itself be at a hazardous potential.

The invention produces very low ground loop current of the order of 150 microamperes, which may be further reduced if desired by altering resistor values. The invention may be easily retrofitted in existing load equipment without requiring any modification of the equipment. The invention has a rapid response, typical circuit response time from ground OK status to fault status being approximately one 60 Hz cycle. Although in a specific embodiment the relay turn-off time is of the order of 30 milliseconds, this turn-off time can be reduced.

The invention provides fault lockout protection. On detecting a fault in the load equipment, the main AC power supply is disconnected. The ground detector circuitry latches in the off state to prevent restarting the load on the removal of the fault condition until the circuit is manually reset by the operator.

Figure 3:
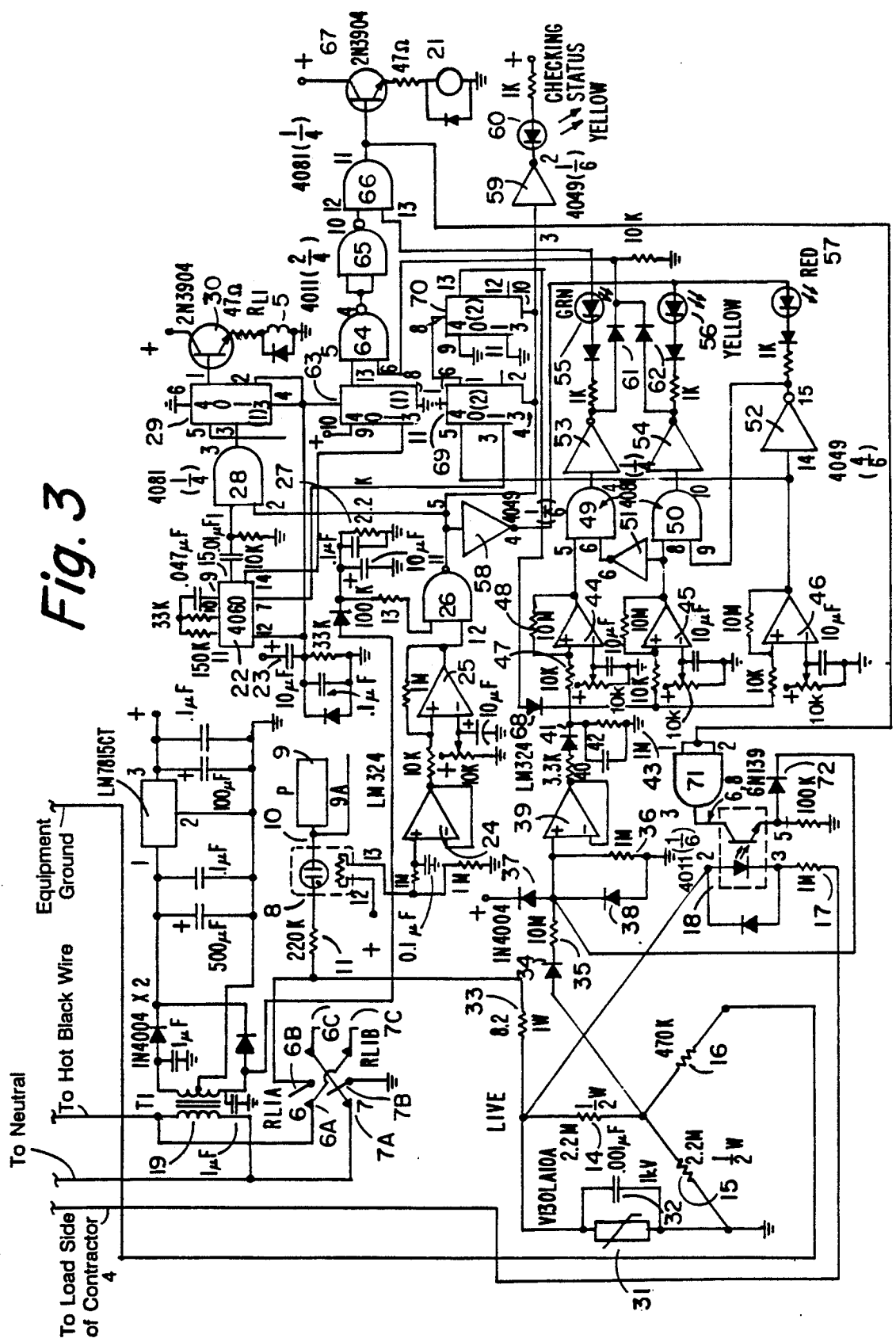
FIG. 3 is a schematic circuit diagram of a preferred embodiment of the invention.

Referring to FIG. 3, there is shown a schematic circuit diagram of a preferred embodiment of the invention. Corresponding elements are identified by the same reference symbol throughout the drawing. Those skilled in the art can readily build an actual working embodiment of the invention from the schematic circuit diagram shown in FIG. 3. Elements already described in FIG. 1 will not ordinarily be described herein, and since circuit components are known to those in the art, they will only be briefly described.

Metal reference ground plate 9 may be a copper rectangular plate 1"×4.5" attached to antenna wire 9A 10" long. Transformer 19, typically a 117/36 CT 135 mA unit in conjunction with a full-wave center tap rectifier and filter capacitors produces an unregulated D.C. voltage of approximately 23 volts regulated by a 7815 series regulator and output filter capacitors to provide the +15 D.C. voltage used by the circuitry.

Transistors 30 and 67 are used as current amplifiers, driving polarity-switching relay 5 and the coil of contactor 21.

Integrated circuit 22 is a CMOS (complementary MOS) binary counter/oscillator with reset that functions as the master clock generator. Power-on-reset circuit 23 initializes the logic circuits on application of 120 VAC power. Thereafter, this circuit is disabled.

Amplifiers 24 and 25 are part of a low power internally compensated quad operational amplifier package. Amplifier 24 functions as a buffer, and amplifier 25 is connected as a comparator with the threshold set by the voltage at the inverting input. Some hysteresis is introduced by feedback resistors to prevent spurious oscillations during the switching transition.

CMOS (complementary MOS) two-input NAND gates 26, 64, 65 and 71 perform logical operations.

Power-off-reset circuit 27 resets the logic circuitry on loss of 120 VAC power.

CMOS two-input AND gates 28, 49, 50 and 66 perform logic functions.

CMOS D-type flip-flops 29, 63, 69 and 70 have independent set and reset inputs and perform logical functions.

Metal-oxide varistor (MOV) 31, capacitor 32 and series resistor 33 help suppress 120 VAC line transients.

Diode 34, resistor 35 and resistor 36 rectify and attenuate the potential at the star point of resistors 14, 15 and 16. Diodes 37 and 38 are protection diodes for clamping the signal during a transient.

Operational amplifier 39 functions as a voltage follower. Operational amplifiers 44, 45 and 46 function as comparators. The output of voltage follower 39 is connected to a peak charging circuit comprising resistor 40, diode 41, capacitor 42 and resistor 43, which is the input to comparators 44, 45 and 46. The threshold voltage on these comparators is set by the voltage on the inverting input. Resistors 47 and 48 of comparator 44, introduce a small amount of hysteresis to eliminate oscillations during switching.

CMOS hex inverters 51–54, 58, 59, characterized by high source and sink capability, in conjunction with gates 49 and 50, are used for priority decoding the outputs of comparators 44, 45 and 46, and for driving the corresponding ground status indicator LEDs 55 (green), 56 (yellow) and 57 (red). Green LED 55 indicates "ground OK," yellow LED 56 indicates "ground open" and red LED 57 indicates "line-to-ground" fault condition. A "checking status" yellow LED 60 is excited while the circuit is in the process of identifying the live terminal.

Small signal diodes 61, 62, 68 and 72 couple signals to different nodes in the circuitry.

Turning now to a description of the operation of the specific circuitry of FIG. 3, operation relative to initialization, identification of the live terminal, checking the status of the equipment ground, preexisting fault detection, fault detection after power is applied to the load and fault lockout protection will be described.

On the application of 120 VAC power, the +15 VDC regulated supply gradually builds up. The regulated supply typically requires about 150 milliseconds to stabilize. Hence a power-on-reset circuit 23 is incorporated to disable all logic operations for about 300 milliseconds. The power-on-reset circuit is disabled after the 300 millisecond period and the logic circuit now resumes its normal operation.

After the power-on-reset circuit is disabled, the circuit proceeds to identify the live terminal. Relay 5 is in the deenergized position, and relay contact 6B is therefore connected to one terminal of the AC power cord. If this is the live terminal, a potential difference is created across neon lamp 8, which fires and couples a signal to the CdS (cadmium sulfide) photocell. This optical signal is filtered by an RC filter and buffered by operational amplifier 24. The output of the buffer is compared with a fixed reference by comparator 25. If the comparator output is a logical 1 (high), logic gates 26 and 28 prevent a clock signal from arriving at the clock terminal of flip-flop 29. Since the flip-flop is a memory element, it remains in this state indefinitely. Consequently the relay contacts 6B, 7B are now held in this state. If terminal 6A was not connected to the live terminal, no signal is received by the CdS photocell, logic gate 28 allows clock/timer IC 22 to send a clock pulse to flip-flop 29 after a predetermined interval. The positive-going transition of the clock pulse changes the state of the flip-flop, which now turns on driver transistor 30, which operates relay 5. Operation of the relay causes contact arms 6B, 7B to switch over. The neon lamp of the neon lamp-photocell assembly 8 is now connected to the other terminal of the 120 VAC power cord, and the circuit checks for a signal from the CdS photocell. The presence of a signal on the CdS photocell would hold the status of relay 5. During this identification process, the "checking status" yellow LED is on to visually indicate to the operator that the circuit is in the process of identifying the live terminal.

Once the live terminal has been identified, the circuit proceeds to phase two of its operation, to check the status of the equipment ground.

The live terminal has been identified and is now connected to one leg of the star-connected resistors 14, 15, 16. Resistor 33, MOV 31 and capacitor 32 are only for transient protection and do not affect normal circuit operation. Resistors 14 and 15 are connected to contact arms 6B and 7B, which are connected to the live and neutral terminals. Since resistor 14 is tied to the live terminal (black wire), resistor 15, by a process of elimination, has to be tied to the neutral terminal (white wire). Resistor 16 is connected to the ground terminal (green wire) of the equipment ground. Consequently, the voltage at the star point accurately represents the status of the equipment ground. This voltage is now rectified by diode 34 and attenuated by resistors 35 and 36. Diodes 37, 38 are protection diodes for clamping the input signal voltage during a transient on the 120 VAC line. This voltage is now buffered by operational amplifier 39 which has a peak detector circuit 40, 41, 42 and 43 on its output. The voltage on capacitor 42 is an accurate representation of the status of the equipment ground. This voltage is at a minimum when the equipment ground is "OK" and at a maximum when the equipment ground is connected to the live terminal. This voltage is compared by comparators 44, 45 and 46 to determine the status of the equipment ground. The comparators have some hysteresis incorporated in them to eliminate oscillations during the switching transient. The hysteresis is obtained by resistors connected to the noninverting input of the operational amplifier. The threshold voltage for each comparator is set by a potentiometer connected to the inverting input of the device. The output of the comparator is priority decoded and buffered by logic gates 49, 50, 51, 52, 53 and 54. The decoded signal excites the corresponding LED which indicates the status of the equipment ground. A decoded signal is also sent to one input of logic gate 64. The other input of gate 64 is controlled by a CMOS D-type flip-flop 63. The output of gate 64 is inverted and "ANDed" with the inverted signal from gate 26. Output of AND gate 66 is applied to transistor 67, which operates contactor coil 21. Operation of the contactor coil closes contacts 3, 4 (FIG. 2) and applies power to the load.

The load may have a preexisting fault condition, prior to the application of the 120 VAC power. In that case the AC power is not permitted to be turned on. A pre-fault status circuit disables the power contactor driver and visually indicates to the operator of the pre-fault condition by the red LED. The circuit latches in the off-state until it is manually reset by the operator.

On power-up the live terminal is identified as shown previously. After identification of the live terminal, the three ground status indicator LEDs are enabled by inverter 58. The preexisting fault detector circuit consisting of resistor 17 and optocoupler 18, injects a small current into one terminal of the load. If there is a fault, and the safety ground is okay, the return path is through the safety ground. If there is a fault in the load, and the safety ground is broken, there will be a return path through ground resistor 16 and neutral resistor 15. In either case there will be a current flow which would excite the LED of optocoupler 18, which would optically couple a signal to the output transistor of optocoupler 18. Diode 72 couples this signal to the non-inverting input of operational amplifier 39. Operational amplifier 39, which is connected as a follower, now charges capacitor 42 of the peak detector circuit and forces comparators 44, 45 and 46 to go to an output high state. The decoding logic gates 49, 50, 51, 52, 53 and 54 identify this state as a fault condition. Consequently, the logic gate 64 remains disabled, the red LED is turned on, and the contactor 21 remains in the off position. Thus no 120 VAC power is applied to the load.

After the circuit checks for preexisting fault conditions (and finds none), power is applied to the load. The ground detector circuit continuously monitors the status of the equipment ground. In case a fault occurs while the power is on, the voltage at the star point of the resistors 14, 15 and 16 immediately increases, which is reflected as an increase in voltage on the peak detector capacitor 42. This increase in voltage forces comparators 44, 45, 46 to go to a logic high, which is decoded as a fault condition. The red LED is turned on, and contactor 21 is turned off, opening contacts 3, 4 (FIG. 2) and disconnecting the power to the load.

The ground detector circuit also incorporates a fault lockout circuit. On the detection of a fault in the load, the fault detection circuit disables all power to the load. Now if the fault is cleared, the 120 VAC power would be once again applied to the load. If the load power switch had been inadvertently left in the on position, the load would be switched on unexpectedly, which may have serious implications for the operator. The fault interlock protection circuit prevents this state of affairs. If a fault is detected, the power to the load is disconnected. A memory element (flip-flop) 70 is set by the fault signal. The output of the flip-flop now sends a lockout signal to peak detector capacitor 42. This forces the comparators to remain in the fault state irrespective of the status of the equipment ground. The red LED stays on, and the contacts 3 and 4 (FIG. 2) remain open. The circuit is now latched in the off state indefinitely. The circuit may be reset by momentarily removing the 120 VAC power to the grounding detector.

Figure 4:
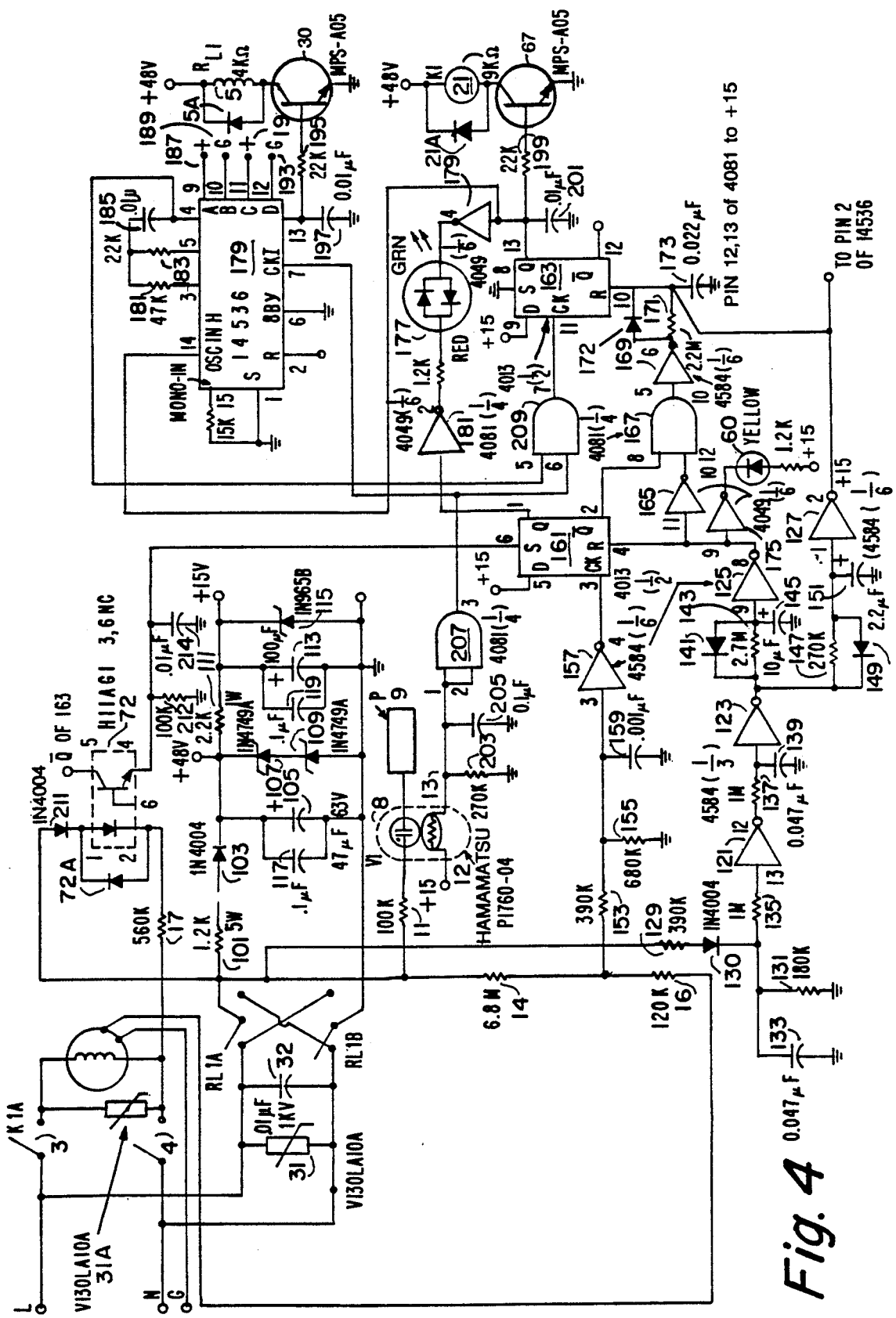
FIG. 4 is a schematic circuit diagram of a preferred commercial embodiment of the invention.

Referring to the circuit of FIG. 4, there is shown a schematic circuit diagram of a preferred commercial embodiment of the invention. Corresponding elements are referred to by the same reference symbol throughout the drawing. Those skilled in the art can readily build an actual working circuit. Elements already described in FIGS. 1, 2 and 3 will not ordinarily be described herein, and since circuit components are known to those in the art, they will only be briefly discussed.

This commercial grounding detector operates off-line, with power resistor 101 used as the dropping resistor for the circuit power supply. The dropping resistor 101, rectifier diode 103, filter capacitor 105, and zener diodes 107, 109 form a 48 VDC regulated supply. Dropping resistor 111, filter capacitor 113 and zener diode 115 form a 15 VDC regulated power supply. Capacitors 117 and 119 are for high frequency bypass purposes. Since the circuit is operated off-line, the power supply transformer 19 in FIG. 3 is not needed. Transistors 30 and 67 are used for amplifying logic signals, and to drive the polarity switching relay 5, and the power contactor 21.

The power-on-reset circuit is built using four CMOS Schmitt trigger inverters 121-127. Resistors 129 and 131, diode 130, and capacitor 133 form a network which applies a rectified AC voltage to resistor 135. Resistor 135 is an input protection resistor for the inverter 121. The output of inverter 121 is connected to an RC circuit 137, 139, whose time constant is determined by the switch-over time of relay 5. Discrete components 141-145 and 147-151 provide time delays at the outputs of inverters 125 and 127 such that there is a specified delay when power is first applied, for proper initialization of the circuit. The circuit also has minimal delay on turn-off. Consequently the circuit has a predetermined delay on turn-on, and yet responds quickly during turn-off.

Selection of suitable values for resistors 129 and 131, capacitor 133 and for dropping resistor 101 would enable the circuit to be disabled if the input line voltage drops below a certain minimum voltage as is known to those familiar with the art. The components may have different values than those specifically disclosed in the circuit. Specifically, power resistor 101 may be a lower value than the corresponding value disclosed in the circuit, at the expense of greater power dissipation.

Resistors 14 and 16 are two resistors of the star point. The third neutral resistor is formed by the series connection of resistors 153 and 155. The voltage divider configuration formed by resistors 153 and 155 determines the voltage which is applied to inverter 157. Capacitor 159 provides a low impedance path for the high frequency noise on the line. Metal oxide varistors 31 and 31A and capacitor 32 help to suppress the line and load transients.

CMOS D flip-flop 161 has its clock input connected to the output of inverter gate 157. The reset terminal is connected to the power-on-reset circuit inverter gate 125. The inverter gate incorporates a Schmitt trigger circuit providing hysteresis. The set terminal is connected to the output of optocoupler IC 72. Logic gates are used to interconnect the reset of flip-flop 161 with flip-flop 163. The logical equivalent is such that a logic low level on the complementary output of flip-flop 161 or a logical high on the input of gate 165 would cause a high level to appear at the reset terminal of flip-flop 163. A timing circuit formed by components 171, 172 and 173 gives a predetermined delay when the output of inverter 169 goes from high to low. The delay is incorporated to enable flip-flop 161 to be clocked by the inverter gate 15 and to reset flip-flop 163, if conditions require it. Lack of a delay may cause flip-flop 163 to momentarily energize power contactor 21 and close the load circuit momentarily, even though the ground is broken or a fault condition exists. To rapidly charge capacitor 173 on turn-on, diodes 172A and 172 are used to supply the charging current.

The yellow indicator LED 60 is the "checking status" LED and is energized during the time the power-on-reset is high, and flip-flop 161 and 163 are reset. The LED is driven by a CMOS inverting buffer 175. LED 177 is a 2-terminal bicolor red/green LED. The LED color is determined by the polarity of its two leads. The red/green LED is driven by CMOS inverter buffers 179 and 181 which have high source and sink current capability. The status of flip-flops 161 and 163 determines the color of the red/green LED 177. Flip-flop 163 also drives transistor 67 through resistor 199, which operates contactor 21. Resistor 199 performs a dual function, as a current limiting element, and as a resistive element in a low pass filter formed by it and capacitor 201. The function of the low pass filter is to prevent high frequency noise on the 48 VDC bus from entering the logic circuits and causing erroneous operation. Diode 21A is a free-wheeling diode and is used to provide a path for the inductive current during the switching operation of contactor 21.

The master clock is generated by IC 179 which is a CMOS programmable timer with a 24 stage ripple binary counter. This timer has set and reset inputs, a clock inhibit input, and an oscillator inhibit input. The timer also has provision for an on-chip oscillator whose frequency is selected by the timing components 181, 183 and 185. Terminals 187-193 are the binary select input terminals and select the flip-flop stage to be connected to the output by a user-determined four-bit select code. The output of timer 179 drives transistor 30 through resistor 195. Transistor 30 operates polarity switching relay 5. Resistor 195 performs a dual function; it provides current limiting for the timer 179 and, in conjunction with capacitor 197, forms a low pass filter. The low pass filter is necessary to prevent high frequency noise on the 48 VDC bus from appearing at the output terminals of the timer and causing erroneous operation. Diode 5A is a freewheeling diode and is used to provide a path for the inductive current during the switching operation of relay 5. Inverter 127 generates the power-on-reset signal for timer 179 and initializes the timer on turn-on.

Metal reference ground plane 9 may be a metal rectangular plate of suitable area to give an adequate output to neon-lamp CdS assembly 8. No antenna wire is used in this circuit as the usable ground plate area is large enough for reliable circuit operation. One end of the neon lamp is connected to the ground plate, and the other is connected to resistor 11. The other end of resistor 11 is tied to the input side of power resistor 101. The output terminal 13 of the neon lamp-CdS optoisolator 8 is connected to pull-down resistor 203 capacitor 205, and logic gate 207. Since the output of the neon lamp-CdS optoisolator 8 is a slowly varying waveform, it may be more preferable to use a logic circuit with hysteresis in place of logic gate 207. The output of logic gate 207 is connected to the clock inhibit terminal of timer 179. This signal is also ANDed with the on-chip RC oscillator (from IC 179) by AND gate 209. The output of AND gate 209 is used to clock flip-flop 163.

Optocoupler 72 is used as prefault detector and supplies a signal to flip-flop 161 under prefault conditions. Diode 211 is used to produce a half-wave rectified signal for the optocoupler 72. Diode 72A is used to prevent reverse biasing of the input LED of optocoupler 72. Resistor 17 is the current limiting resistor to limit the prefault current to the load. Resistor 212 is used as a pull-down resistor, and capacitor 214 is used to bypass the high frequency noise.

Operation of this circuit is as follows. Assume that on the application of 120 VAC power the live terminal is connected to the input side of power resistor 101. Filter capacitors 105 and 113 charge up to their respective DC voltages (48 VDC & 15 VDC). Outputs of inverters 125 and 127 reset flip-flop 161 and timer 179. Logic gates 165, 167, 169 and 127 also reset flip-flop 163. This power-on-reset process allows the power supply to stabilize and initializes all counters and flip-flops. It also allows the neon lamp-CdS output terminal 13 to reach a logical high level. The analog output of the neon lamp-CdS optoisolator 8 is now converted to a digital signal by gate 207 and is applied to one input of AND gate 209 and to clock inhibit input of timer 179. The clock inhibit input inhibits counting and hence holds the output of timer 179, and consequently relay 5 is not energized. During this time the yellow "checking-status" LED 60 is energized. When the output of inverters 125 and 127 go low, the reset of flip-flop 163 is disabled, and the flip-flop gets clocked by AND gate 209. This causes the output of flip-flop 163 to go to a logical high, and consequently transistor 67 energizes contactor 21. Energizing contactor 21 closes contacts 3 and 4 and applies power to the load. Since the output of flip-flop 163 is high and the output of flip-flop 161 is low, inverter buffers 179 and 181 energize the green LED chip of the bicolor LED 177. After power is applied to the load, the oscillator of timer 179 is disabled by flip-flop 163.

If the live terminal was not connected to the input end of power resistor 101, the neon lamp of the neon lamp-CdS optoisolator 8 remains off, and there is no signal on the output terminal 13 of the optoisolator 8. Consequently, there is no signal on the output of AND gate 207, which is connected to the clock inhibit terminal of timer IC 179. A low signal on the clock inhibit terminal allows the counter of timer 179 to continue clocking until the required number of clock pulses are counted. The number of clock pulses is determined by the input four-bit select code applied to terminals 187-193. After the required number of clock pulses have been counted, the output of timer 179 changes state, and energizes the relay 5 via transistor 30. Energizing the relay reverses the input 120 VAC connections to the power resistor 101 and consequently to the neon lamp of the neon lamp-CdS optoisolator 8. This process continues until the live terminal is located.

If now the ground wire in the power cord or in the AC power outlet is broken and floating, or broken and in contact with the live wire, the output of inverter 157 applies a 60 Hz signal to flip-flop 161. This 60 Hz signal causes flip-flop 161 to change state which sends a reset signal to flip-flop 163 via logic gates 165-169. Flip-flop 163 is reset, and transistor 67 is turned off de-energizing contactor 21, and opening contacts 3 and 4. Since the output of flip-flop 163 is low, the red LED chip of the bicolor LED 177 is energized via inverter buffers 179 and 181. The circuit is now latched in the off state indefinitely, since flip-flop 161, being a memory element, will maintain its last status.

To reset the system it is necessary to momentarily interrupt the 120 VAC power. This activates the power-on-reset circuit and initializes all counters and flip-flops.

The circuit also checks for a prefault condition in the load. On power-on, after the live terminal is connected to the input side of power resistor 101, the circuit applies power to the load through diode 211, optocoupler 72 and current-limiting resistor 17. If a fault exists, there is a current path, and a current flows through optocoupler 72, which sends a signal to flip-flop 161, setting flip-flop 161. This is indicated to the operator by energizing the red LED chip of the red/green bicolor LED 177, while the yellow "checking-status" LED 60 is still energized. After the power-on-reset signal goes low, the yellow LED 60 turns off, and only the red LED stays on. Energizing both LEDs for a short period informs the operator that a prefault condition exists. In this condition flip-flop 163 remains reset, contactor 21 is not energized, and contacts 3 and 4 remain open. Consequently no power is applied to the load. The circuit is now latched on in the off state indefinitely.

To reset the system, it is necessary to momentarily interrupt the 120 VAC power to the circuit. This activates the power-on-reset circuit, and initializes all counters and flip-flops.

Figure 5:
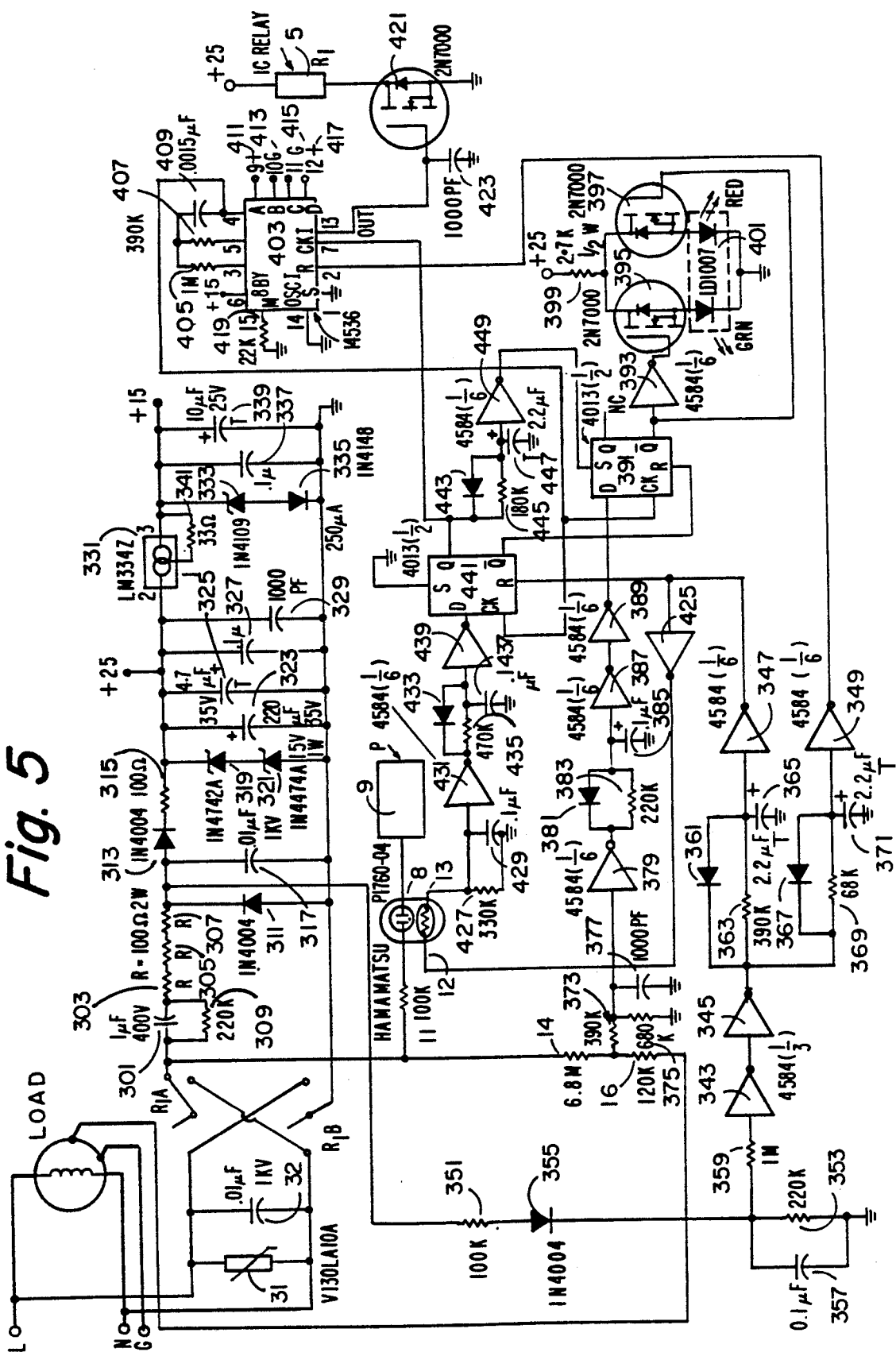
FIG. 5 is a schematic circuit diagram of another commercial embodiment of the invention.

Referring to the circuit of FIG. 5, there is shown a different schematic diagram of a preferred commercial embodiment of the circuit. Corresponding elements are referred to by the same reference symbol throughout the drawing. Those skilled in the art can readily build an actual working circuit. Elements already described in FIGS. 1, 2 and 3 will not ordinarily be described herein, and since circuit components are known to those in the art, they will only be briefly discussed.

This grounding detector circuit differs from the previous circuits in that it has no power contactor nor a prefault detector circuit, is nonlatching, and has a much shorter response time.

As in the previous circuit, this commercial grounding detector operates off-line, with capacitor 301 providing the current-limiting impedance for the circuit power supply. This method of using a reactive element to limit the current results in a much lower power dissipation, and a correspondingly lower temperature rise within an enclosure. Resistors 303, 305, 307 placed in series with capacitor 301, are used to limit the turn-on transient current. The current in the 120 VAC circuit is almost exactly in quadrature with the line voltage, resulting in negligible power dissipation, and consequently a much lower temperature rise within the enclosure. Resistor 309 is the discharge resistor and is used to discharge capacitor 301 when the 120 VAC power is removed. Series diode 313 and shunt diode 311 perform the rectification of the input AC voltage. Capacitor 317 provides a low reactance path for high frequency noise.

The rectified voltage from diode 313 is filtered by resistor 315 and capacitor 323, to form a 25-volt DC supply. Zener diodes 319 and 321 clamp at 12 and 15 volts, respectively. Consequently the clamping action of the series connection of the two zeners only comes into play when the 25-volt DC supply approaches 27 volts. Using a slightly higher zener clamping voltage than the typical DC power supply voltage results in almost no current being shunted by the zeners under normal operation, and yet provides a reasonable degree of regulation. Since no current is shunted by the zeners under normal operation, the input line current requirements decrease, with a corresponding impact on the input components (301, 303, 305 and 307). Current source 331 manufactured by National Semiconductor, zener diode 333, diode 335 and filter capacitor 339 form a 15-volt DC regulated power supply. Current source 331 is a three-terminal adjustable current source with a wide dynamic voltage range of 1 to 40 volts. The set current is defined by resistor 341. Zener diode 333 is a 15 V 250 mW zener designed for low level operation. Capacitors 325, 327, 329 and 337 are for high frequency bypass purposes. Since the circuit is operated off-line, the power supply transformer 19 in FIG. 3 is not needed.

The power-on-reset circuit is built using four CMOS inverters 343-349. Resistors 351 and 353, diode 355 and capacitor 357 form a network which applies a rectified AC voltage to resistor 359. Resistor 359 is an input protection resistor for the inverter 343. Discrete components 361-365 and 367-371 provide time delays at the inputs of inverters 347 and 349 such that there is a specified delay when power is first applied, for proper initialization of the circuit. The circuit also has minimal delay on turn-off. Consequently the power-on-reset circuit has a predetermined delay on turn-on, and yet responds quickly during turn-off.

Resistors 14 and 16 are two resistors of the star point. The third neutral resistor is formed by the series connection of resistors 373 and 375. The voltage divider configuration formed by resistors 373 and 375 determines the voltage applied to inverter 379. Capacitor 377 provides a low impedance path for the high frequency noise on the line. Metal oxide varistor 31 and capacitor 32 help to suppress the 120 VAC line transients.

Discrete components 381, 383, 385 and inverters 387, 389 provide a data signal for CMOS D flip-flop 391. The complementary output of flip-flop 391 drives inverter 393 and MOSFET 397. MOSFETs 395 and 397 and resistor 399 form the red/green LED driver. The red/green LED 401 manufactured by Siemens is a two-color LED with three terminals, one of which is the common cathode. This three-terminal red/green LED has a much greater luminous intensity than the two-terminal bicolor red/green LED used in the grounding detector circuit of FIG. 4.

The master clock is generated by IC 403 which is a CMOS programmable timer with a 24-stage ripple binary counter. This timer has set and reset inputs, a clock inhibit input and an oscillator inhibit input. The timer also has provision for an on-chip oscillator whose frequency is selected by the timing components 405, 407 and 409. Terminals 411–417 are the binary select input terminals and select the flip-flop stage to be connected to the output by a user determined four-bit select code. Resistor 419 is a pull-down resistor connected to terminal 15 of timer 403. The output of timer 403 is connected to the gate of MOSFET 421, which drives polarity switching relay 5. Relay 5 is an IC relay with a maximum operating inrush current of 85 mA (28 V) and a steady-state current of 0.13 mA (28 V). Since this IC relay utilizes the charge and discharge of an internal capacitor, the steady state operating power is negligible, resulting in the decrease in the size of the power supply components. Capacitor 423 prevents high frequency noise on the 25 VDC from appearing at the output terminals of the 25 VDC bus timer and causing erroneous operation of the entire circuit. Inverter 349 generates the power-on-reset signal for the timer 403 and initializes the timer at turn-on.

Metal reference ground plane 9 may be a metal rectangular plate of suitable area to give an adequate output to neon lamp-CdS assembly 8. No antenna wire is used in this circuit as the usable ground plate area is large enough for reliable circuit operation. One end of the neon lamp is connected to the ground plate, and the other is connected to resistor 11. The other end of resistor 11 is tied to the input side of power capacitor 301. The output of inverter 425 is connected to terminal 12 of the neon lamp-CdS assembly 8. The output terminal 13 of the neon lamp-CdS optoisolator 8 is connected to resistor 427, capacitor 429, and inverter 431. Discrete components 433, 435 and 437 provide an unsymmetric time delay at the input of inverter 439. The output of inverter 439 is connected to the data input of CMOS D flip-flop 441. The reset terminal is tied to the power-on-reset circuit inverter gate 347. The complementary output of flip-flop 441 is connected to the reset terminal of flip-flop 391. The clock inputs of flip-flops 441 and 391 are connected to pin 4 of timer IC 403. Diode 443, resistor 445, capacitor 447 and inverter 449 give a predetermined delay when the output of flip-flop 441 changes state. This delay is incorporated in the circuit to indicate to the user that the circuit has identified the live terminal, and is now ready to display the actual status of the equipment ground.

Operation of this circuit is as follows. Assume that on the application of 120 VAC power the live terminal is connected to the input side of capacitor 301. Filter capacitors 323 and 339 gradually charge up to their respective DC voltages (25 VDC & 15 VDC). Outputs of inverters 347 and 349 reset flip-flop 441 and timer 403. The output of flip-flop 441 resets flip-flop 391. This power-on-reset process allows the power supply to stabilize and initializes all counters and flip-flops. After the power-on-reset is disabled, the neon lamp-CdS optoisolator output increases until it reaches a logical high level. The analog output of the neon lamp-CdS optoisolator 8 is now converted to a digital signal and is applied to the data input of flip-flop 441. Since the output of the neon lamp-CdS optoisolator is at a logical high, the arrival of the next clock pulse from timer 403 causes the output of flip-flop 441 to be a logical high. This output is connected to the clock inhibit input of timer 403. The clock inhibit now holds the output of timer 403, and consequently relay 5 is not energized.

Prior to the output of flip-flop 441 changing state, the reset terminal of flip-flop 391 is at a logical high, and the red LED is energized. When flip-flop 441 changes state, the reset of flip-flop 391 is disabled. However the set terminal is at a logical high, due to the timing circuit formed by the diode 443, resistor 445 and capacitor 447. During this time the green LED is energized. After a predetermined time, the set terminal of flip-flop 391 becomes low and is disabled. The data to flip-flop 391 can now be clocked in. Consequently, the red/green LED now would display the status of the equipment ground. In summarizing, on power-up, the red LED chip is energized and remains energized until the power-on reset goes low, and the live terminal has been identified. When the reset of flip-flop 441 is disabled and the live terminal has been identified, the green LED chip is energized for a fraction of a second. The green LED is used to indicate to the operator that the circuit is now ready to display the actual status of the equipment ground. After approximately 0.4 seconds, the red/green LED displays the status of the equipment ground.

If the live terminal was not connected to the input end of capacitor 301, the neon of the neon lamp-CdS optoisolator 8 remains off, and there is no signal on the output terminal 13 of the optoisolator 8. Consequently there is no signal on the output of inverter 439, and the output of flip-flop 441, which is tied to the clock inhibit terminal of timer IC 403, remains at a logical low. A low signal on the clock inhibit terminal allows the counter of timer 403 to continue clocking until the required number of clock pulses are counted. The number of clock pulses is determined by the input four-bit select code applied to terminals 411–417. After the required number of clock pulses have been counted, the output of timer 403 changes state and energizes relay 5 via MOSFET 421. Energizing the relay reverses the input 120 VAC connections to capacitor 301 and consequently to neon lamp-CdS optoisolator 8. This process continues until the live terminal is located.

If now the ground wire in the power cord, or in the AC power outlet is broken and floating, or broken and in contact with the live wire, the output of inverter 389 applies a logical low signal to flip-flop 391. This low signal causes the flip-flop 391 to change state, causing the output of inverter 393 to go to a logical low. The output of inverter 393 is connected to MOSFET 395, which turns off, deenergizing the green LED chip. The output of flip-flop 391 also turns on MOSFET 397, energizing the red LED chip of the red/green LED 401.

Once the live terminal is detected, the two color red/green LED indicates the actual status of the equipment ground at all times. Since this particular grounding detector circuit is nonlatching, it is not necessary to interrupt the 120 VAC power and to activate the power-on reset circuitry each time the ground is broken, and the red LED is energized.

The circuits of FIGS. 4 and 5 check for a ground connection in the AC power cord and in the AC power outlet. An open ground or a broken ground in contact with the live wire is indicated as a fault condition. The ground status is correctly indicated irrespective of the polarity of the live and neutral terminals. A prefault detection circuit is incorporated in the circuit of FIG. 4 to check for a prefault condition on the load. The functional difference in the circuits of FIGS. 4 and 5 is that the former circuit (FIG. 4) has a prefault detection circuit to detect a prefault condition in the load and a power contactor to control the application of power to the load. The latter circuit (FIG. 5) does not have a power contactor or a prefault detector circuit. The latter circuit also does not have the yellow "checking status LED" since this circuit has a much faster response and consequently there is no long "wait state." The circuit of FIG. 5 is also a non-latching circuit, and indicates the actual status of the equipment ground at all times.

Figure 6:
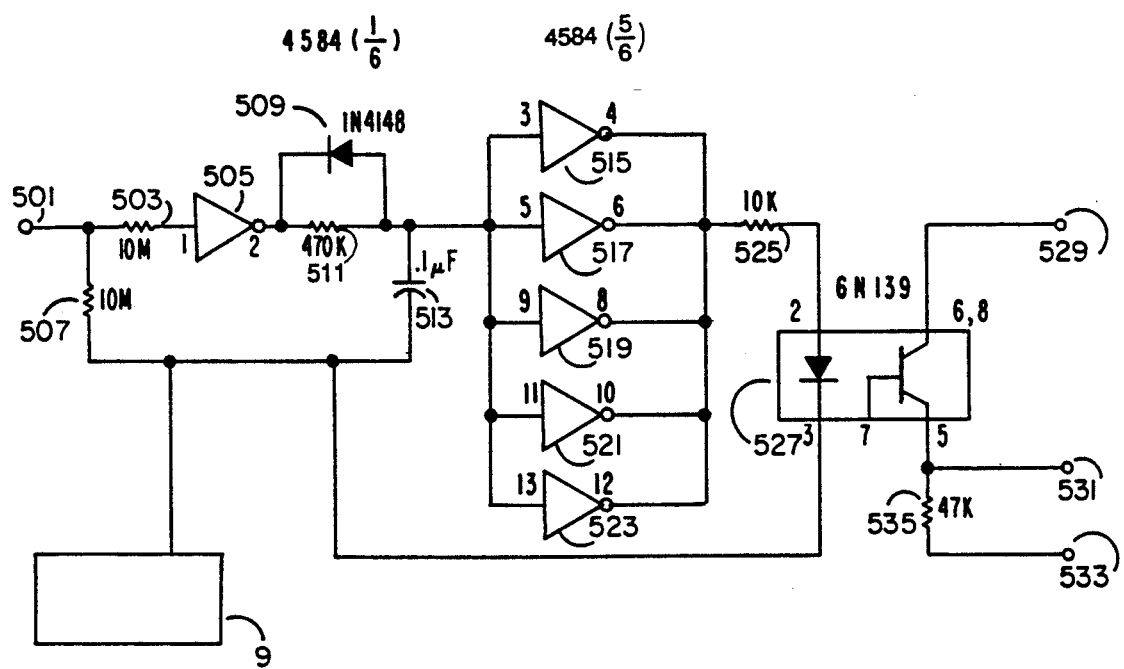
FIG. 6 is a schematic circuit diagram of an alternate circuit for detecting the ungrounded a-c line.

The live terminal may also be detected by using the circuit of FIG. 6. Terminal 501 is the input terminal which is connected to arm 6B of the DPDT switch of FIG. 2. Resistor 503 is an input protection resistor for CMOS inverter gate 505. Resistor 507 is a pull-down resistor connected to ground plate 9. No antenna wire is needed in this case as the signal is adequate with the ground plate alone. Discrete components 509, 511 and 513 provide an unsymmetrical time delay at the input of inverters 515–523. The output terminals of these inverters are connected together and connected to resistor 525 which drives optocoupler 527. The output of optocoupler 527 indicates if the live terminal is connected to the input terminal 501. An isolated power supply or a battery of adequate voltage is used to power this circuit. It may also be necessary to incorporate some filtering within the circuit to ensure the reliability of the circuit.

The circuit may be built integral with electrical equipment to be monitored as shown in FIG. 1A, in a box with receptacles at the end of an extension cord as shown in FIG. IB, integral with a wall receptacle, as a portable unit to test receptacles or other equipment for grounding, and in other ways that will be suggested to those skilled in the art.

The invention may be embodied in single-phase three-wire, 240/120-V circuits, three-phase, three-wire and four-wire circuits, battery-operated for checking grounding of nonelectrically operated equipment, such as air-powered paint-spray pumps, or in other forms. The invention may include one or more test buttons for checking functions, such as by grounding a test point. The invention may be embodied without the contactor for controlling the load equipment, just providing a visible and/or audible alarm on sensing a fault condition. While CMOS logic circuits are described above, other forms of logic circuits, such as TTL or LSTTL, may be used.

The following notes will be helpful in building actual circuitry shown in FIGS. 3–6.

FIG. 3 NOTES

1. All diodes IN4148 except as noted.
2. All resistors ¼W 5% except as noted. All resistance values in ohms.
3. 0.1 microfarad decoupling capacitors on all ICs (not shown).
4. 10 microfarad capacitors are tantalum.
5. Plate dimensions 1"×4 ½" covered with 0.004" metal.
6. Antenna 10" of #20 AWG.
7. Transformer-Stancor P-8611.
8. Power supply connections for ICs (not shown on schematic):

| | | |
|---|---|---|
| LM 324N | Pin 4 +15V; | Pin 11 P.S. gnd. |
| 14 Pin CMOS IC | Pin 14 +15V; | Pin 7 P.S. gnd. |
| 16 Pin CMOS IC | Pin 16 +15V; | Pin 8 P.S. gnd. |
| 4049 IC | Pin 1 +15V; | Pin 8 P.S. gnd. |
| | | Pin 16 NC, Pin 13 NC |

9. 6N139 Pin 1, 4, 7, NC.
10. All operational amplifiers are LM324N
11. Inverting input or op amp 44 at 2.3 V Inverting input of op amp 45 at 4.3V Inverting input of op amp 46 at 7.3 V
12. Relay 5, Contactor 21 are Calectro D1-884 DPDT-12VDC-7A Contact 120 V AC -7A Coil 12 VDC 900 mW
13. Optoisolator 8 has neon lamp, Sylvania NE-2A (A2A), and CdS, Hamamatsu P201D-5R. The neon lamp and the CdS are glued together. The assembled unit is covered with a potting compound to give mechanical strength and to prevent ambient light interference. Resistor 11 is also potted within this assembly.

FIG. 4 NOTES

1. All diodes IN4148 except as noted.
2. All resistors ¼W 5% except as noted. All resistance values in ohms.
3. 0.1 microfarad decoupling capacitors on all ICs (not shown).
4. 10 microfarad and 2.2 microfarad capacitors are tantalum.
5. Ceramic capacitors rated at 50 V.
6. Ground plate area is 11 square inches.
7. Red/green LED IDI Model 4301H1/5
8. Contactor 21 AROMAT ST2E-DC48V
9. Relay 5 MIDTEX 190-22D100
10. Power supply connections for ICs (not shown on schematic):

| | | |
|---|---|---|
| 14 Pin CMOS IC | Pin 14 +15V; | Pin 7 P.S. gnd. |
| 16 Pin CMOS IC | Pin 16 +15V; | Pin 8 P.S. gnd. |
| 4049 IC | Pin 1 +15V; | Pin 8 P.S. gnd. |
| | | Pin 13, Pin 16 NC |

11. H11AG1 optocoupler Pins 3, 6 NC.

FIG. 5 NOTES

1. All diodes are 1N4148 except as noted.
2. All resistors are ¼W 5% except as noted. All resistance values in ohms.
3. All capacitors in microfarad except as noted. Ceramic capacitors rated at 50 V except as noted.
4. Ground plate area is 8 square inches.
5. IC relay $R_1$ AROMAT DS2-C-24V
6. Capacitors with 'T' are tantalum capacitors.
7. All zeners are 5% tolerance.
8. 0.1 microfarad decoupling capacitors on all ICs (not shown).
9. Red/green LED Siemens LD1007.
10. Power supply connections for ICs (not shown on schematic):

| | | |
|---|---|---|
| 14 Pin CMOS IC | Pin 14 +15V; | Pin 7 P.S. gnd. |
| 16 Pin CMOS IC | Pin 16 +15V; | Pin 8 P.S. gnd. |

FIG. 6 NOTES

1. All resistors are ¼ watt 5%.
2. One 0.1 microfarad decoupling capacitor is connected on the power supply terminals of CMOS IC 4584.
3. Ground plate dimensions 3"×5".
4. Power supply connections for the ICs (not shown on the schematic):

| | | |
|---|---|---|
| 4584 | Pin 14 | Vdd |
| | Pin 7 | Vss |
| 6N139 | Pin 1, 4, 7 NC | |

(NC = No connection)

5. Use +15 V dc power supply for the CMOS IC 4584. Pin 7 of CMOS IC 4584 is connected to the ground plate.

There has been described novel apparatus and techniques for fault detecting. It is evident that those skilled in the art may now make numerous other uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Fault monitoring apparatus comprising,
   antenna means for providing a reference potential,
   at least first and second leads for receiving signals representative of at least hot and nonhot potentials on a piece of load equipment to be monitored,
   and means for comparing signals on said leads with said reference potential to provide an indication of the potential on at least one of said leads.

2. Fault monitoring apparatus in accordance with claim 1 wherein said means for comparing comprises,
gas discharge bulb means responsive to the potential thereacross exceeding a predetermined ignition potential for being illuminated,
and photodetecting means responsive to illumination of said gas discharge bulb means for providing a signal indicating that the potential being sensed is said hot potential.

3. Fault monitoring apparatus in accordance with claim 2 and further comprising,
polarity reversing relay means connected between hot and nonhot ones of said leads for connecting one of said leads to said gas discharge bulb means,
live wire detector circuit means responsive to a signal from said photodetecting means indicating illumination of said gas bulb means for inhibiting operation of said polarity reversing relay means,
and timing circuit means for enabling operation of said polarity reversing relay means in the absence of a signal from said photodetecting means to cause the other of said leads to be connected to said gas-discharge bulb means.

4. Fault monitoring apparatus in accordance with claim 1 and further comprising,
ground status detector means for sensing the potential on the enclosure of the load equipment being monitored,
contactor means for selectively delivering power to the load equipment being monitored,
said ground status detector means being responsive to said enclosure being at a potential different from said reference potential for preventing enablement of said contactor and the application of power to said load equipment,
said ground status detector being responsive to said enclosure means being at said reference potential for enabling said contactor means to provide power to said load equipment.

5. Fault monitoring apparatus in accordance with claim 4 and further comprising,
resistive network comprising a Y network having one leg connected to the hot one of said leads, having a second leg connected to logic power supply reference ground and having a third leg connected to a lead for connection to said enclosure,
photo-optical coupling means for current measuring an isolation having an input connected between said first leg and a lead for connection to said enclosure, and its output to the input of said ground status detecting means,
the junction of Y network being coupled to said ground status detecting means, whereby the absence of a ground connection to said enclosure or the presence of a potential different from said reference potential thereon activates said ground status detecting means to disable said contactor means and prevent the flow of power to said load equipment.

6. Fault monitoring apparatus in accordance with claim 1 wherein said means for comparing comprises,
optocoupling means intercoupling said antenna means and one of said first and second leads for providing a signal representative of the relationship between said reference potential and the potential on the latter lead.

7. Fault monitoring apparatus in accordance with claim 1 and further comprising,
polarity reversing means connected between hot and non-hot ones of said leads for connecting one of said leads to said means for comparing,
live wire detector circuit means responsive to a signal from said means for comparing indicating said hot potential for inhibiting operation of said polarity reversing means,
and timing circuit means for enabling operation of said polarity reversing means in the absence of a signal from said means for comparing indicating said hot potential to cause the other of said leads to be connected to said means for comparing.

8. Fault monitoring apparatus comprising,
means for providing an artificial reference potential by an isolated capacitance effect,
at least first and second leads for receiving signals representative of at least hot and nonhot potentials on a piece of load equipment to be monitored,
and means for comparing signals on said leads with said reference potential to provide an indication of the potential on at least one of said leads.

9. Fault monitoring apparatus in accordance with claim 8 wherein said means for comparing comprises,
gas discharge bulb means responsive to the potential thereacross exceeding a predetermined ignition potential for being illuminated,
and photodetecting means responsive to illumination of said gas discharge bulb means for providing a signal indicating that the potential being sensed is said hot potential.

10. Fault monitoring apparatus in accordance with claim 9 and further comprising,
polarity reversing relay means connected between hot and nonhot ones of said leads for connecting one of said leads to said gas discharge bulb means,
live wire detector circuit means responsive to a signal from said photodetecting means indicating illumination of said gas bulb means for inhibiting operation of said polarity reversing relay means,
and timing circuit means for enabling operation of said polarity reversing relay means in the absence of a signal from said photodetecting means to cause the other of said leads to be connected to said gas-discharge bulb means.

11. Fault monitoring apparatus in accordance with claim 8 and further comprising at least a third lead for receiving a signal of nonhot potential,
said nonhot potentials being neutral and ground potentials on said load equipment to be monitored.

12. Fault monitoring apparatus in accordance with claim 11 wherein said means for comparing comprises,
optocoupling means intercoupling said antenna means and one of said first and second leads for providing a signal representative of the relationship between said reference potential and the potential on the latter lead.

13. Fault monitoring apparatus in accordance with claim 11 wherein said means for comparing comprises,
gas discharge bulb means for current measuring and isolation responsive to the potential thereacross exceeding a predetermined ignition potential for being illuminated,
and photodetecting means responsive to illumination of said gas discharge bulb means for providing a signal indicating that the potential being sensed is said hot potential.

14. Fault monitoring apparatus in accordance with claim 13 and further comprising, polarity reversing relay means connected between hot and neutral ones of said leads for connecting one of said leads to said gas discharge bulb means, live wire detector circuit means responsive to a signal from said photodetecting means indicating illumination of said gas discharge bulb means for inhibiting operation of said relay means, and timing circuit means for enabling operation of said relay means in the absence of a signal from said photodetecting means to cause the other of said leads to be connected to said gas discharge bulb means.

15. Fault monitoring apparatus in accordance with claim 8 and further comprising, ground status detector means for sensing the potential on the enclosure of load equipment being monitored, contactor means for selectively delivering power to load equipment being monitored, said ground status detector means being responsive to said enclosure being at a potential different from said reference potential for preventing enablement of said contactor and the application of power to said load equipment, said ground status detector being responsive to said enclosure being at said reference potential for enabling said contactor means to provide power to said load equipment.

16. Fault monitoring apparatus in accordance with claim 15 and further comprising, a resistive network comprising a Y network having one leg connected to the hot one of said leads, having a second leg connected to logic power supply reference ground and having a third leg connected to a lead for connection to said enclosure, photo-optical coupling means for current measuring and isolation having an input connected between said first leg and a lead for connection to said enclosure, and its output to the input of said ground status detecting means, the junction of Y network being coupled to said ground status detecting means, whereby the absence of a ground connection to said enclosure or the presence of a potential different from said reference potential thereon activates said ground status detecting means to disable said contactor means and prevent the flow of power to said load equipment.

17. Fault monitoring apparatus in accordance with claim 8 and further comprising at least a third lead for receiving a signal of nonhot potential, said nonhot potentials being neutral and ground potentials on said load equipment to be monitored.

18. Fault monitoring apparatus in accordance with claim 17 and further comprising, ground status detector means for sensing the potential on the enclosure of the load equipment being monitored, contactor means for selectively delivering power to the load equipment being monitored, said ground status detector means being responsive to said enclosure being at a potential different from said reference potential for preventing enablement of said contactor and the application of power to said load equipment, said ground status detector means being responsive to said enclosure means being at said reference potential for enabling said contactor means to provide power to said load equipment.

19. Fault monitoring apparatus in accordance with claim 17 wherein said means for comparing comprises, optocoupling means intercoupling said means for providing an artificial reference potential and one of said first and second leads for providing a signal representative of the relationship between said reference potential and the potential on the latter lead.

20. Fault monitoring apparatus in accordance with claim 17 wherein said means for comparing comprises, gas discharge bulb means for current measuring and isolation responsive to the potential thereacross exceeding a predetermined ignition potential for being illuminated, and photodetecting means responsive to illumination of said gas discharge bulb means for providing a signal indicating that the potential being sensed is said hot potential.

21. Fault monitoring apparatus in accordance with claim 20 and further comprising, polarity reversing relay means connected between hot and neutral ones of said leads for connecting one of said leads to said gas discharge bulb means, live wire detector circuit means responsive to a signal from said photodetecting means indicating illumination of said gas discharge bulb means for inhibiting operation of said relay means, and timing circuit means for enabling operation of said relay means in the absence of a signal from said photodetecting means to cause the other of said leads to be connected to said gas discharge bulb means.

22. Fault monitoring apparatus in accordance with claim 17 and further comprising, ground status detector means for sensing the potential on the enclosure of load equipment being monitored, contactor means for selectively delivering power to load equipment being monitored, said ground status detector means being responsive to said enclosure being at a potential different from said reference potential for preventing enablement of said contactor and the application of power to said load equipment, said ground status detector being responsive to said enclosure being at said reference potential for enabling said contactor means to provide power to said load equipment.

23. Fault monitoring apparatus in accordance with claim 22 and further comprising, a resistive network comprising a Y network having one leg connected to the hot one of said leads, having a second leg connected to logic power supply reference ground and having a third leg connected to a lead for connection to said enclosure, photo-optical coupling means having an input connected between said first leg and a lead for connection to said enclosure, and its output to the input of said ground status detecting means, the junction of said Y network legs being coupled to said ground status detecting means, whereby the absence of a ground connection to said enclosure or the presence of a potential different from said reference potential thereon activates aid ground status detecting means to disable said contractor means and prevent the flow of power to said equipment load means.

24. Fault monitoring apparatus in accordance with claim 22 and further comprising,
- a resistive network comprising a Y network having one leg connected to the hot one of said leads, having a second leg connected to logic power supply reference ground and having a third leg connected to a lead for connection to said enclosure,
- photo-optical coupling means having an input connected between said first leg and a lead for connection to said enclosure, and its output to the input of said ground status detecting means,
- the junction of said Y network legs being coupled to said ground status detecting means,
- whereby the absence of a ground connection to said enclosure or the presence of a potential different from said reference potential thereon activates said ground status detecting means to disable said contactor means and prevent the flow of power to said equipment load means.

25. Fault monitoring apparatus in accordance with claim 8 wherein said means for comparing comprises,
- optocoupling means intercoupling said means for providing an artificial reference potential and one of said first and second leads for providing a signal representative of the relationship between said reference potential and the potential on the latter lead.

26. Fault monitoring apparatus in accordance with claim 8 and further comprising,
- polarity reversing means connected between hot and nonhot ones of said leads for connecting of said leads to said means for comparing,
- live wire detector circuit means responsive to a signal from said means for comparing indicating said hot potential for inhibiting operation of said polarity reversing means,
- and timing circuit means for enabling operation of said polarity reversing means in the absence of a signal from said means for comparing indicating said hot potential to cause the other of said leads to be connected to said means for comparing.

* * * * *